United States Patent [19]

Hanks

[11] Patent Number: 4,891,821
[45] Date of Patent: Jan. 2, 1990

[54] MAGNETIC CORRECTING FENCE FOR ADJACENT E-GUNS

[76] Inventor: Charles W. Hanks, 3661 Willowick Dr., Ventura, Calif. 93003

[21] Appl. No.: 329,396

[22] Filed: Mar. 27, 1989

[51] Int. Cl.$^4$ ............................................. H01J 37/305
[52] U.S. Cl. ......................................................... 373/16
[58] Field of Search ........................ 373/10, 11, 12, 13, 373/14, 16; 219/121.16, 121.26, 121.27, 121.28; 250/396 R, 396 ML, 427

[56] References Cited

U.S. PATENT DOCUMENTS 3,170,019  2/1965  Hanks ..................................... 373/16
3,270,233  8/1966  Dietrich .................................. 373/16

Primary Examiner—Roy N. Envall, Jr.
Attorney, Agent, or Firm—Linval B. Castle

[57] ABSTRACT

A plurality of electron gun assemblies having transverse magnetic fields to focus an electron beam into a crucible to vaporize a material may be closely placed in parallel by inserting between the assemblies a thin magnetic fence magnetized across its surfaces. The polarity of a fence surface is the same as the polarity of the adjacent sidewall magnet forming the transverse field so that the opposition will prevent magnetic flux from passing between adjacent assemblies and a resulting distortion and defocusing of the electron beam.

7 Claims, 2 Drawing Sheets

MAGNETIC CORRECTING FENCE FOR ADJACENT E-GUNS

CROSS REFERENCE TO RELATED APPLICATION

This application is related to my copending U.S. patent application, Ser. No. 07/121,152, filed Nov. 16, 1987 now U.S. Pat. No. 4,835,789.

BACKGROUND OF THE INVENTION

This invention relates generally to electron guns and in particular to a correcting magnetic system for isolating the individual magnetic fields in closely adjacent electron gun assemblies.

Electron guns (e-Guns) are extensively used for metal evaporation and vacuum deposition upon substrate materials and involves the magnetic focusing of an intense electron beam from an electron emitter into a crucible containing the evaporant source material to be evaporated. The focusing of the electrons is usually accomplished by a transverse magnetic field generated at the end of the crucible opposite the electron emitter, but a more modern and improved system involves the use of vertical side magnets aligned along the sides of the e-Gun assembly and in the area of the beam path to form a transverse field to guide the electrons into the crucible.

The e-Gun assembly is formed of a rectangular block of nonferrous metal with a centrally located circular well in the top surface forming the crucible. The electron source is an emitter located at one end and magnetic flux generating permanent magnets or electromagnets suitably positioned to focus the electron beam into the crucible. When two or more e-Gun assemblies are brought together, there is the danger that their magnetic flux fields will interact to destroy the focus of their beams into the crucibles. This becomes a serious problem if a plurality of e-Guns are closely adjacent each other to use for vapor mixing or the simultaneous evaporation and deposition of multiple component layers in a single vacuum cycle. Normally for simultaneous evaporation, it is advantageous to position two or more e-Guns close together and equidistant from the substrate for vapor mixing or multi-layer deposition to assure the same degree of vapor mixing of evaporants or a greater coating rate and thus a higher efficiency of operation.

The problem of flux interaction and massive skewing of the magnetic fields in closely adjacent e-Gun assemblies has been recognized for many years and is discussed in my U.S. Pat. No. 3,475,542 of November 1969. To reduce this problem, present technique requires that the assemblies are staggered in a line in what is referred to as an "opposed-parallel" mode in which all North pole magnets along one side of an assembly are adjacent the North poles on the side of the next adjacent assembly, and South poles are adjacent South poles. In this configuration the adjacent poles of adjacent assemblies are oppositely polarized so that there is minimal distortion of the flux path of each assembly. This allows adjacent e-Gun assemblies to be spaced to within about ¼ inch between pole pieces. However, a problem with this configuration is that, although a long linear array of assemblies can be made, the high voltage (e.g. 10 Kv.) supplied to the electron emitters at the ends of the staggered adjacent assemblies requires HV conductors and HV leads on both sides of the set of crucibles. This larger area of HV components makes for a markedly larger number of High Voltage arc-down and gaseous discharges, and HV insulators over a larger area of the chamber floor.

Placing the electron beam assemblies in a strict parallel mode with all emitters along one side of a multi-assembly evaporation unit places the magnets and poles in positions so that the magnetic sidewall poles of adjacent assemblies not only do not repel each other as in the opposite-parallel mode, but they attract each other and cause massive skewing of the fields and electron beam paths. The e-Gun magnetic fields act as one big magnet with field lines passing from an outside pole of one assembly over and above all intermediate poles to the outer pole of the most distal pole in the parallel assembly. The presence of the field lines above the adjacent parallel gun assemblies causes a flattening of the normal field lines in that region where the electrons fly as well as a change in the field line direction and the general electron focusing and skewing accuracy.

For reasonable operation in such a parallel mode, the adjacent assemblies must be separated by nearly the width of an assembly to eliminate such interaction The system to be described eliminates the need for such physical separation and permits the accurate focusing of the electron beam in each of several assemblies in a parallel-parallel mode with adjacent assembly spacing of only about ¼ inches.

Briefly described, the invention is for a fence magnet that is wafer thin to be positioned between aligned adjacent electron evaporation assemblies. The adjacent assemblies are normally spaced about ¼ inches and the wafer-like magnet, having a thickness of about ⅛ inch is centrally positioned in the gap between and parallel with the sidewalls of the assemblies. The magnets are polarized through the thin direction of the wafer so that all of one surface will be a North polarity and the opposite surface is South polarity. The side surfaces, being oppositely polarized, are positioned in the gap so that their polarity repels that of the adjacent assembly pole. This prevents cross action of fields between adjacent assemblies and allows the assembly magnets to properly focus the electron beam into the crucible.

BRIEF DESCRIPTION OF THE DRAWINGS

In the drawings which illustrate the preferred embodiment of the invention.

DETAILED DESCRIPTION

Figure 1:
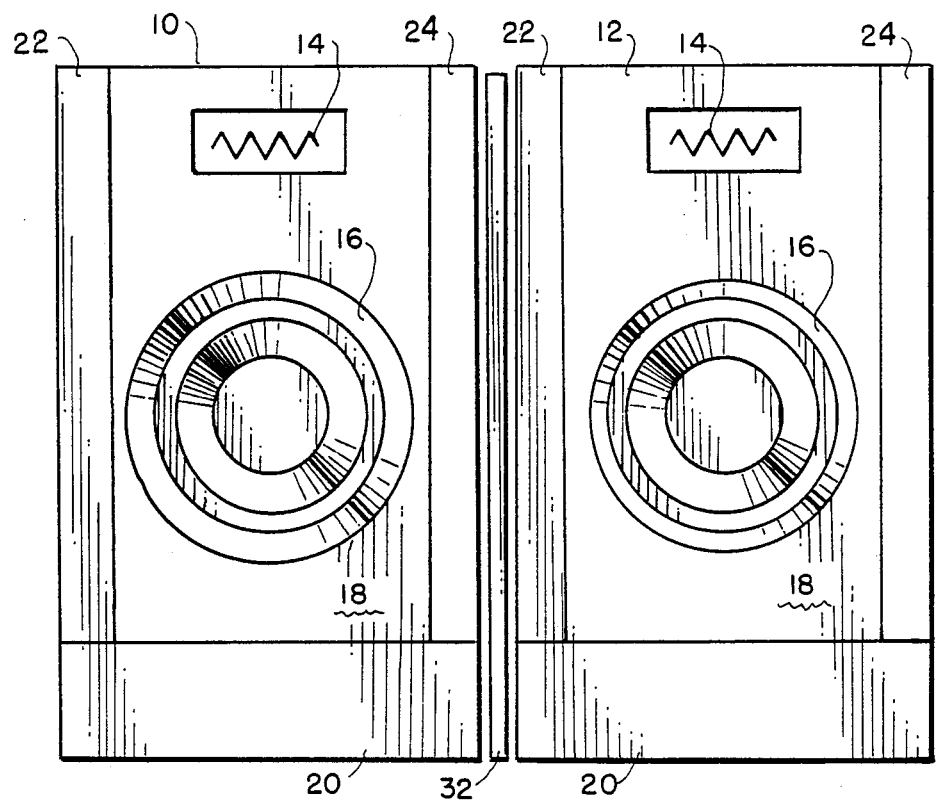
FIG. 1 is a schematic plan view of two adjacent e-Gun assemblies separated by a magnetic interdicting fence.

Illustrated in FIG. 1 are two adjacent identical e-Gun assemblies 10, 12, each having an elctrically generated electron emitter 14 normally consuming as much as 15 Kw of power and each having a circular well forming a crucible 16 near the center of a copper block 18 that is suitably cooled by the flow of a coolant through passages surrounding the crucibles. A large magnet 20 is located in the end of the block 18 opposite the emitter 14 and two parallel steel pole pieces 22, 24, are arranged on each side of the block to thereby form parallel planar exterior poles.

Flux from the large magnet 20 is conducted forward toward the emitter by the side parallel pole pieces 22, 24. In FIG. 1, the pole 22 would be a North magnetic and pole 24 a South pole such that lines of force would go from pole 22 across the through the area of crucible 16. Force lines would also cross the top at the top and bow upward. Thus, electrons coming upward from the emitter 14 will be constrained to move toward the large end magnet 20, but will be focused to a smaller size and will impact the evaporant in the crucible 16. In each assembly, the oppositely polarized poles 22, 24, together with the large end magnet 20, may be thought of as a U-shaped magnet that produces a transverse magnetic field to guide and focus electrons from the emitter 14 to the surface of an evaporant in the crucible 16.

When two or more e-Gun assemblies, such as the assemblies 10 and 12 are closely adjacent, the adjacent poles 22, 24 are of opposite polarities and there is a strong magnetic flux interaction between them. To reduce this interference, the assemblies normally must be separated to eliminate a massive skewing of the electron beam and disruption of its impact pattern. As previously mentioned, staggering of assemblies in an opposed parallel pattern reduces the problem but creates others. The magnetic fence now to be described, when, inserted between adjacent poles, enables a plurality of identical assemblies to be positioned about ¼ inch apart and to operate properly without distortion of the electron beam pattern. Thus, a plurality of evaporants may be placed nearly equidistant from a substrate in a vacuum chamber so that co-evaporation of a plurality of materials may be vapor deposited on the substrate in a single vacuum cycle.

The magnetic fence comprises one or more thin magnets magnetized through the thin dimension so that, when placed between two magnet poles of adjacent parallel e-Gun assemblies with the polarity of the fence surfaces corresponding to that of the adjacent pole, will interdict the magnetic force passing between the adjacent assemblies. The fence thus effectively forces each e-Gun assembly in a close parallel pattern to function as if isolated.

Figure 2:
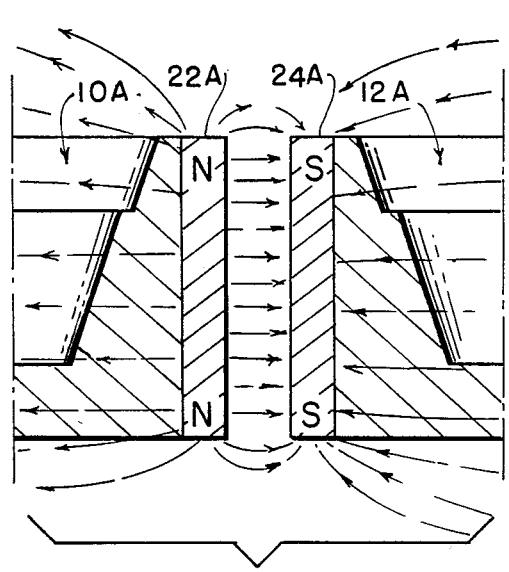
FIG. 2 is cross sectional elevation view of the median area of two adjacent parallel assemblies and illustrates magnetic action without magnetic interdiction.

FIG. 2 illustrates the effect on the magnetic field lines at the interface between two e-Gun assemblies 10A and 12A. Even though the poles 22A, 24A are in two different systems, the close proximity of the opposite poles plus the high field intensity pulls field lines across from one assembly to the other. The diversion of this much magnetic flux away from the transverse fields above and near the crucible changes the intensity and direction of the field lines and causes massive skewing of the e-beam.

Figure 3:
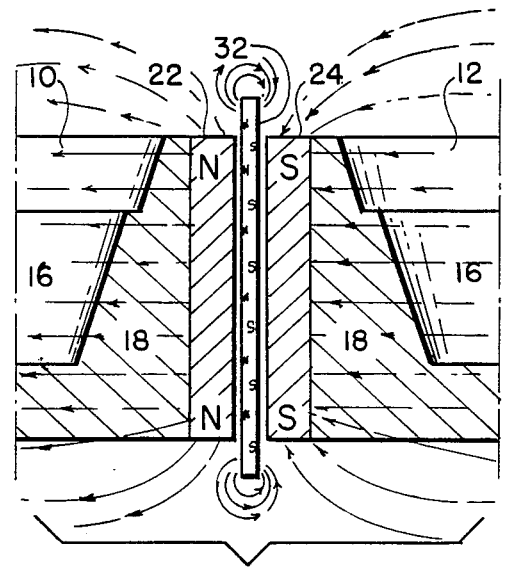
FIG. 3 is a cross sectional view of the assemblies of FIG. 2 illustrating the magnetic action with magnetic interdiction.

FIG. 3 illustrates the effects on magnetic conditions by installation of the interdicting magnetic fence that prevents field lines from crossing over or through the gap between adjacent poles.

Figure 4:
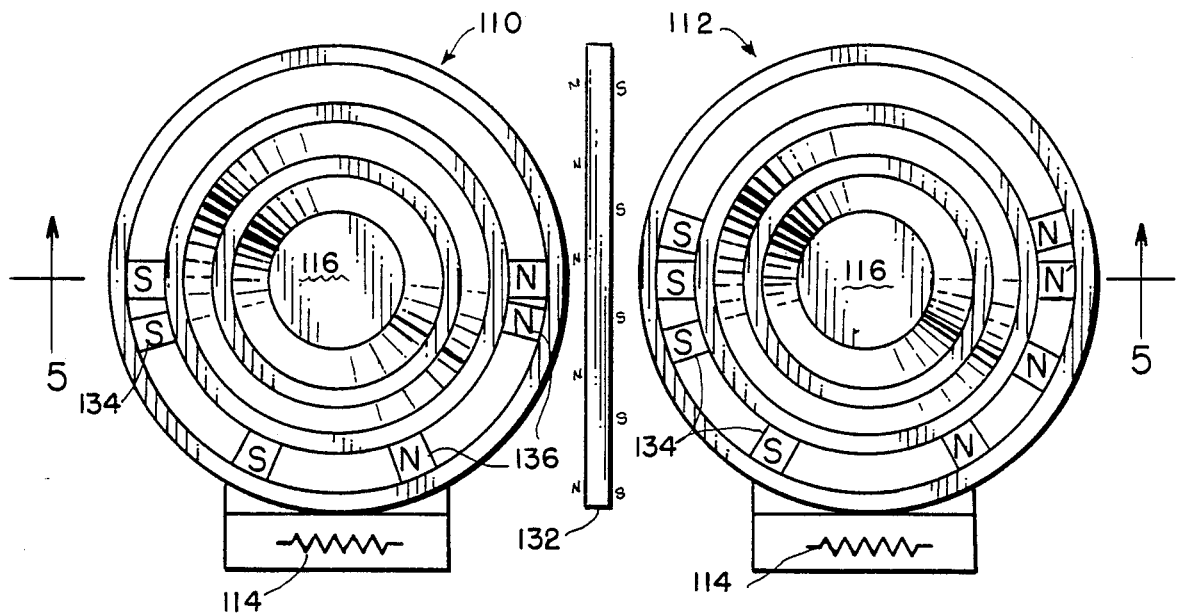
FIG. 4 is a schematic plan view of an alternate embodiment of an e-Gun parallel pair with magnetically different structures and interdicting fence.

FIG. 4 is a sectional plan view of a portion of a new types of e-Gun assembly such as described in my copending application, Ser. No. 07/121,152. Each of the two illustrated assemblies comprise a water cooled copper crucible block with crucible 118, an electron emitter 114 positioned at one end thereof and a series of two or more magnets places along the e-beam pathway. The top ends of those magnets placed on the right side of the e-beam path of each assembly 110, 112, such as magnets 136, are North poles while the bottom ends are South poles. The top ends of the left side magnets 134 are South whereas the bottom ends are North poles. Across the bottom of the assembly and magnetically interconnected to the bases or bottom ends of the magnets 134 and 136 is a steel plate 128, as shown in the elevational view of FIG. 5. The system thus forms a U-shaped magnet that produces a transverse magnetic field across the top of the crucible 118 to focus and properly deflect the electron beam. Water cooled copper heat shields 138 and 140 surround each assembly and protect the magnets. If desired, pole pieces 126 may be used to cap and protect the top surface of the magnets.

Figure 5:
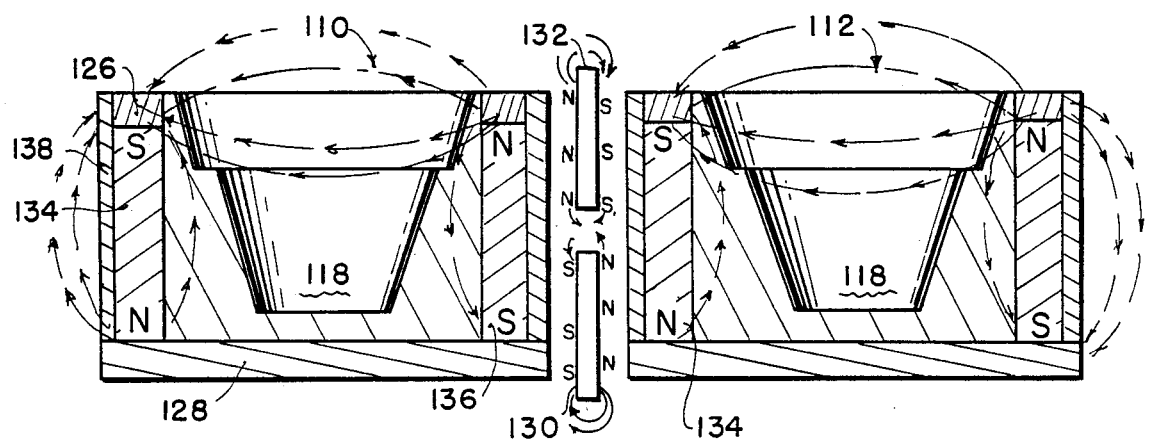
FIG. 5 is a cross sectional elevation view of the assemblies taken along the lines 5—5 of FIG. 4.

FIG. 5 is an sectional elevational view taken along the lines 5—5 of FIG. 4 and illustrates the typical flux patterns between adjacent assemblies after insertion of the interdicting magnetic fence. In this embodiment, each of the magnets 134, 136 has alternate top and bottom polarities; therefore the fence magnet must also have alternate top and bottom polarities on each surface. The fence must therefore be formed of two separate wafer-thin vertically spaced elements 130, 132, each with its surfaces polarized to be identical with that of its adjacent magnet 134, 136 to repel the magnetic attraction between the adjacent assemblies.

Illustrated between the closely spaced assemblies 110 and 112 of FIG. 5 is an upper fence 132 and a lower fence 130 each formed of a wafer-thin material magnetized across the wafers so that a North appears on one surface and a South pole on the opposite surface. The upper fence 132 is positioned so that its North polarized surface is adjacent the North polarity on the top ends of the adjacent magnet 136 and so that the opposite South polar surface is adjacent the South top ends of its adjacent magnet 134. Similarly the surface polarities of the lower fence 130 will correspond to the lower end polarities of their adjacent magnets 134, 136.

The upper and lower fences 130, 132 must be vertically spaced and must be separated near the center of the magnets 134, 136 where the flux intensity is near zero. The amount of vertical spacing between the fences 130, 132 need not be great and only sufficient to oppose any magnetic field that may attempt to pass from the ends of the magnets around the spacing between the fences. It is important, however, that both segments of the fence extend from the ends of the sidewall bars as shown in the figures to prevent all leakage around the ends, top, and bottom. The amount of the extension will depend upon the field strength of the magnets and the fence segments 30,32. In the preferred embodiment, the ends of the fence segments extend beyond the pole pieces 126 by two gap widths or about ¼ inch.

The desired field strengths of the fence magnets should be nearly the same as the strengths of the nearby main source fields generated by the magnets. Weaker fence fields decrease the intensity of the main source fields because of an increase in leakage flux through and around the fence and the electron beam impact point on the evaporant moves farther from the emitter. Stronger fence fields decrease normal magnetic leakage of the e-Gun fields and tend to sharpen the electron beam and impact it closed to the emitter.

Having thus described the invention, what I claim is as follows.

I claim:

1. In combination with a plurality of spaced substantially identical electron gun assemblies in parallel, each assembly having top and bottom surfaces, a centrally disposed crucible formed in a coolable housing, an electron emitter spaced from said crucible, and first and second sidewalls formed by first and second oppositely polarized magnets positioned in each of said assemblies and on each side of a line between said emitter and said crucible for producing a magnetic field across said top surface for directing and focusing an electron beam from said emitter into said crucible, a magnetic correction fence interposed between adjacent ones of said spaced parallel assemblies said fence comprising:

a thin magnetic wafer magnetized with opposite magnetic polarity on the side surfaces, said wafer positioned between the sidewalls of two spaced parallel assemblies and having a magnetic polarity on its surface identical to the magnetic polarity of the magnetic bar forming the adjacent sidewall of an electron gun assembly.

2. The magnetic correction fence claimed in claim 1 wherein the dimensions of said fence is greater than the adjacent magnetized surface to reduce flux leakage between adjacent parallel assemblies.

3. The magnetic correction fence claimed in claim 1 wherein said fence is formed into first and second coplanar vertically spaced segments, the surface polarity of each of said segments being identical to the magnetic polarity of that portion of the magnet forming the adjacent sidewall of the assembly.

4. The magnetic correction fence claimed in claim 2 wherein the magnetic field strength of said fence substantially equals the strength of the magnetic fields produced by the electron gun assembly.

5. The magnetic correction fence claimed in claim 2 wherein the magnetic field strength of said fence may be higher or lower than the strength of the magnetic fields produced by the electron gun assembly depending upon the degree of magnetic flux path correction required.

6. The magnetic correction fence claimed in claim 2 wherein the fence extends above the top surface of said assembly for prevention of magnetic flux leakage around the top edge of said magnetic correcting wafer.

7. The magnetic correction fence claimed in claim 6 wherein the fence extends below the bottom surface of said assembly for prevention of flux leakage around the bottom edge of said magnetic wafer.

* * * * *